United States Patent
Chang et al.

(10) Patent No.: US 9,257,642 B1
(45) Date of Patent: Feb. 9, 2016

(54) PROTECTIVE SIDEWALL TECHNIQUES FOR RRAM

(71) Applicant: Taiwan Semiconductor Manufacturing Co., Ltd., Hsin-Chu (TW)

(72) Inventors: Yao-Wen Chang, Taipei (TW); Jian-Shiou Huang, Fangliao Township (TW); Hsing-Lien Lin, Hsin-Chu (TW); Cheng-Yuan Tsai, Chu-Pei (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/332,577

(22) Filed: Jul. 16, 2014

(51) Int. Cl.
| | |
|---|---|
| *H01L 27/24* | (2006.01) |
| *H01L 27/112* | (2006.01) |
| *H01L 29/417* | (2006.01) |
| *H01L 29/45* | (2006.01) |
| *H01L 29/86* | (2006.01) |
| *H01L 45/00* | (2006.01) |

(52) U.S. Cl.
CPC ........ *H01L 45/1253* (2013.01); *H01L 45/1233* (2013.01); *H01L 45/146* (2013.01); *H01L 45/16* (2013.01)

(58) Field of Classification Search
None
See application file for complete search history.

(56) References Cited

U.S. PATENT DOCUMENTS

| 7,033,856 | B2* | 4/2006 | Lung | 438/95 |
|---|---|---|---|---|
| 2011/0186798 | A1* | 8/2011 | Kwon et al. | 257/2 |
| 2013/0112935 | A1* | 5/2013 | Himeno et al. | 257/4 |
| 2013/0140515 | A1* | 6/2013 | Kawashima et al. | 257/4 |
| 2013/0214230 | A1* | 8/2013 | Sills | 257/1 |
| 2013/0313507 | A1* | 11/2013 | Song et al. | 257/4 |
| 2014/0252295 | A1* | 9/2014 | Liao et al. | 257/2 |
| 2014/0258626 | A1* | 9/2014 | Kang | 711/125 |
| 2014/0264233 | A1* | 9/2014 | Tu et al. | 257/4 |
| 2014/0269005 | A1* | 9/2014 | Kang | 365/148 |
| 2015/0092481 | A1* | 4/2015 | Lee et al. | 365/158 |

OTHER PUBLICATIONS

Definition of align downloaded from URL < http://www.merriam-webster.com/dictionary/align > on Apr. 15, 2015.*

* cited by examiner

*Primary Examiner* — Joseph Schoenholtz
(74) *Attorney, Agent, or Firm* — Eschweiler & Associates, LLC

(57) ABSTRACT

Some embodiments relate to a resistive random access memory (RRAM). The RRAM includes a RRAM bottom metal electrode, a variable resistance dielectric layer arranged over the RRAM bottom metal electrode, and a RRAM top metal electrode arranged over the variable resistance dielectric layer. A capping layer is arranged over the RRAM top metal electrode. A lower surface of the capping layer and an upper surface of the RRAM top metal electrode meet at an interface. Protective sidewalls are adjacent to outer sidewalls of the RRAM top metal electrode. The protective sidewalls have upper surfaces at least substantially aligned to the interface at which the upper surface of the RRAM top metal electrode meets the lower surface of the capping layer.

19 Claims, 4 Drawing Sheets

PROTECTIVE SIDEWALL TECHNIQUES FOR RRAM

BACKGROUND

In modern integrated circuits, the use of metal-insulator-metal (MIM) capacitor structures has become widespread in recent years. MIM capacitor structures can be used as capacitive elements in some implementations; and are formed in back-end-of-line (BEOL) processing, after front-end-of line (FEOL) processing has been completed. In other words, MIM capacitor structures are formed in or over metal interconnect layers that extend in horizontal planes over a semiconductor substrate in which active devices have been formed.

MIM capacitor structures are not limited to capacitor applications, however, and are also utilized for resistive random access memory (RRAM) devices. These RRAM devices include a variable resistance dielectric layer placed between top and bottom RRAM electrodes. The present disclosure relates to improved RRAM devices, as well as methods of making and operating such devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
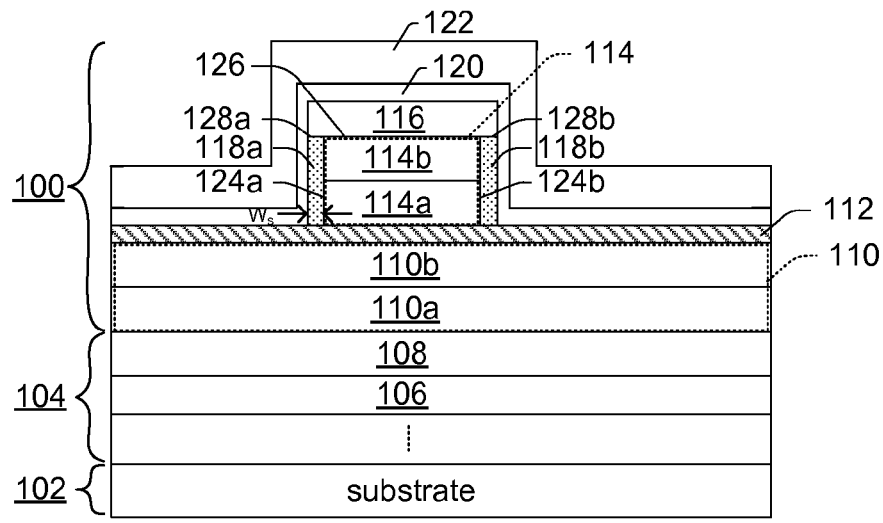
FIG. 1 illustrates a cross-sectional view of an RRAM cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Conventional RRAM cells include RRAM top and bottom electrodes, which are separated by a dielectric layer. During normal operation, the resistance of the dielectric layer is changed between different predetermined (e.g., discrete) resistance levels to correspond different discrete data states to be stored in an RRAM cell. As has been appreciated in the present disclosure, however, conventional RRAM cells are susceptible to a mode of failure known as premature voltage breakdown or burn out. This mode of failure can be caused for example by residue on sidewalls of conventional RRAM top electrodes or by etch damage to sidewalls of conventional RRAM top electrodes caused by an etch used to form the RRAM top electrodes. More particularly, this residue or etch damage can lead to shorts or narrow vertical pathways in outer edges of the variable resistance dielectric layer between the RRAM top and bottom electrodes. Hence, if present, these shorts or narrow vertical pathways can cause an applied voltage to surge across the RRAM top and bottom electrodes (i.e., through the shorts or narrow pathways in the variable resistance dielectric layer), causing premature voltage failure or burn out of the RRAM cell. Moreover, because this residue or etch damage has traditionally occurred only for a very small number of RRAM cells due to small manufacturing variation between the RRAM cells, the precise nature of this problem had been difficult to understand, let alone mitigate, until the present disclosure.

FIG. 1 shows some embodiments of a RRAM cell 100 in accordance with some embodiments, which can mitigate premature voltage breakdown and burnout issues. The RRAM cell 100 is formed over a semiconductor substrate 102, such as a bulk silicon substrate or a silicon-on-insulator (SOI) substrate with an interconnect structure 104 arranged thereover. The interconnect structure 104 includes a series of conductive layers 106 and insulating layers 108 that are arranged over one another in alternating fashion. Although only a single conductive layer 106 and insulating layer 108 are shown, it will be appreciated that any number of such layers can be present. The interconnect structure 104 typically provides electrical coupling between devices disposed in an active region of semiconductor substrate 102, and/or between one or more RRAM cells 100, and/or between an active device in substrate 102 and an RRAM cell. The conducting layers 106 can manifest as metal layers (e.g., metal0, metal1, which can be made of copper, tungsten, aluminum, lead; or alloys thereof; among others), and the insulating layers 108 can manifest as low-k dielectric or SiO2 layers, for example. Vias and/or contacts (not shown) can extend vertically through insulating layer(s) to couple metal lines of different metal layers to one another.

Over or within the interconnect structure 104, the RRAM cell 100 includes a RRAM bottom metal electrode 110, a variable resistance dielectric layer 112, and an RRAM top metal electrode 114. Protective sidewalls 118a, 118b are adjacent to RRAM top metal electrode sidewalls 124a, 124b and can help protect the RRAM cell 100 from premature voltage breakdown or burn out. A capping layer 116, which is configured to store oxygen, can be present over the top metal electrode 114 and helps facilitate resistance changes within the variable resistance dielectric layer 112. An etch stop layer 120, such as an SiO2 layer for example, and a conformal protective layer 122, such as a SiN layer for example, can also be present in some embodiments.

The protective sidewalls 118a, 118b act as a barrier or buffer to prevent or limit residue from the RRAM top metal electrode sidewalls 124a, 124b from damaging the variable resistance dielectric layer 112. The protective sidewalls 118a, 118b also act as a barrier or buffer to prevent damage to the RRAM top metal electrode 114 itself, and to prevent corresponding damage-susceptibility to the variable resistance dielectric 112 when an etch is used to form the RRAM top metal electrode 114. The protective sidewalls 118a, 118b can be made of a different material than the RRAM top metal electrode 114. For example, in some embodiments the RRAM top metal electrode 114 is made of a first material that includes a metal component, and the protective sidewalls

118a, 118b are made of a second material that includes the metal component and an oxide or nitride component.

In some implementations, the RRAM bottom metal electrode 110 can include a lower bottom metal electrode layer 110a and an upper bottom metal electrode layer 110b, which are made of different materials. In some embodiments, the lower bottom metal electrode layer 110a can be a TaN layer with a thickness of approximately 100 angstroms, and the upper bottom metal electrode layer 110b can comprise a TiN layer with a thickness of approximately 50 angstroms. The lower bottom metal electrode layer 110a can be formed by plasma vapor deposition (PVD) while the upper bottom metal electrode layer 110b can be formed by plasma enhanced atomic layer deposition (PEALD).

In some embodiments, the variable resistance dielectric layer 112 is a hafnium oxide ($HfO_2$) layer, which is well suited for formation of "filaments" believed to be the operable mechanism for RRAM. The variable resistance dielectric layer 112 can extend continuously over the RRAM bottom metal electrode 110. As shown, the RRAM top metal electrode 114 overlies less than all of the RRAM bottom metal electrode 110, thereby giving the RRAM cell 100 a "top-hat" shape in some regards.

In some embodiments, the RRAM top metal electrode 114 is made of a first material that includes a metal component, and the protective sidewalls 118a, 118b are made of a second material that includes the metal component and an oxide or nitride component. For example, the RRAM top metal electrode 114 can comprise titanium nitride and the protective sidewalls 118a, 118b can comprise titanium oxide nitride. In some embodiments, the RRAM top metal electrode 114 can include a lower top metal electrode layer 114a and an upper top metal electrode layer 114b, which are made of different materials. In some embodiments, the lower top metal electrode 114a layer can be a capping Ti layer and the upper top metal electrode layer 114b can comprise a TiN layer, a TaN layer, or a TaN layer over a TiN layer. In some embodiments, the RRAM top metal electrode 114 can have an overall thickness or "height" of approximately 600 angstroms, and the protective sidewalls 118a, 118b can each have a width, $w_s$, of approximately 50 angstroms to approximately 70 angstroms.

The capping layer 116 is configured to act as a storage reservoir for oxygen, which can help facilitate resistance changes within the dielectric data storage layer 112. In some embodiments, a lower surface of the capping layer 116 and an upper surface of the RRAM top metal electrode 114 meet at an interface 126, which can be planar, concave, or convex. In some embodiments, the capping layer 116 may comprise a metal or a metal oxide that has a relatively low oxygen concentration. For example, in some embodiments, the capping layer 116 comprises an SiN or SiON layer, and can have a thickness of approximately 300 angstroms. In some embodiments, the protective sidewalls 118a, 118b have upper surfaces 128a, 128b which are at least substantially aligned to an upper surface of RRAM top metal electrode 114 and/or which are at least substantially aligned to interface 126.

During normal operation, the resistance of the variable resistance dielectric layer 112 is changed between different predetermined levels to correspond different discrete data states stored in the RRAM cell 100. Depending on an applied voltage, the variable resistance dielectric layer 112 will undergo a reversible change between a high resistance state associated with a first data state (e.g., a '0') and a low resistance state associated with a second data state (e.g., a '1'). For example, a first voltage applied to the variable resistance dielectric layer 112 will induce conductive filaments (e.g., oxygen vacancies) to form across the variable resistance dielectric layer 112, thereby reducing the resistance of the variable resistance dielectric layer 112 to correspond to a first data state (e.g., a '1'). On the other hand, a second voltage applied across the variable resistance dielectric layer 112 will dissociate these conductive filaments (e.g., by "stuffing" oxygen back into the conductive filaments), thereby increasing the resistance of the variable resistance dielectric layer 112 to correspond to a second data state (e.g., a '0'). Again, during this operation, the protective sidewalls 118a, 118b help to limit premature voltage failure or burn out of the RRAM cell 100, often by limiting manufacturing artefacts/defects that can hamper device reliability.

Figure 2:
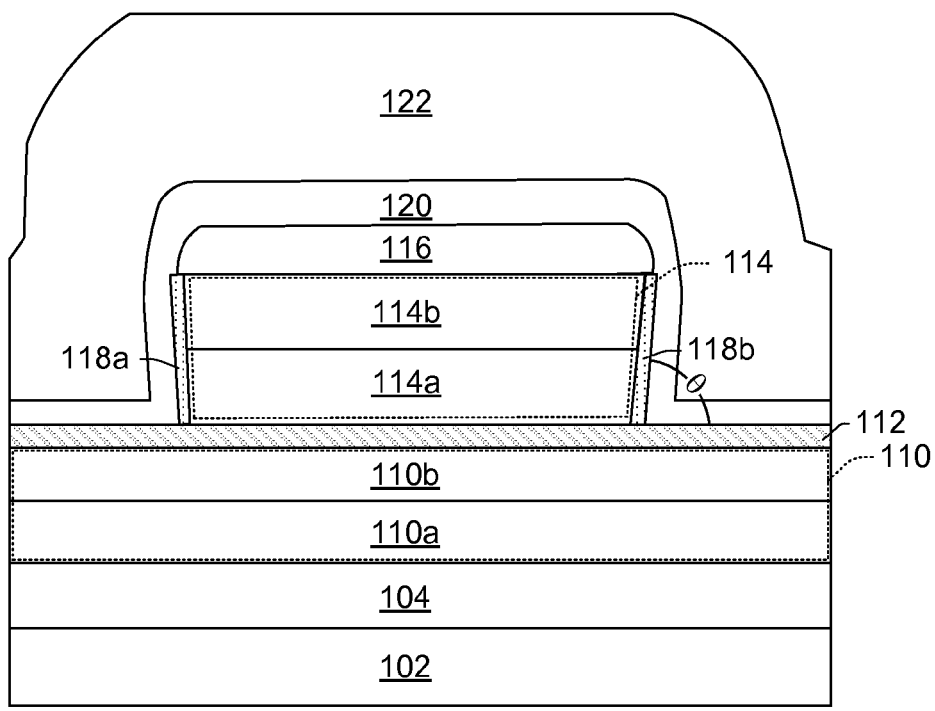
FIG. 2 illustrates a cross-sectional view of a RRAM cell in accordance with some embodiments.

FIG. 2 shows another example of a cross-sectional view of an RRAM cell 200. There is nothing in this image that should be construed as limiting, but rather it is provided only as a non-limiting example Like FIG. 1's embodiment, RRAM cell 200 includes protective sidewalls 118a, 118b. These protective sidewalls 118a, 118b are adjacent to outer sidewalls of the RRAM top metal electrode 114, and are arranged to underlie a bottom surface of the capping layer 116. The protective sidewalls 118a, 118b act as a barrier or buffer to prevent or limit residue from the top electrode sidewalls from damaging the variable resistance dielectric layer 112 between the RRAM top and bottom metal electrodes 110, 114. The protective sidewalls 118a, 118b also act as a barrier or buffer to prevent damage to the RRAM top electrode 114 itself, and to prevent corresponding damage-susceptibility to the variable resistance dielectric 112 when an etch is used to form the RRAM top electrode 114.

In FIG. 2's example, the RRAM top electrode sidewalls are angled at a non-normal angle to help ensure the layers properly form during manufacture. For example, in the illustrated embodiment, an acute angle, θ, of less than 90° and greater than 60° can be present between the top electrode sidewall and top surface of variable dielectric layer. It will be appreciated that the semiconductor substrate 102 may comprise any type of semiconductor material including a bulk silicon wafer, or SOI wafer. The substrate may be a binary compound substrate (e.g., GaAs wafer), or higher order compound substrate, with or without additional insulating or conducting layers formed there over, among others; and is not limited to the illustrated layers.

Figure 3:
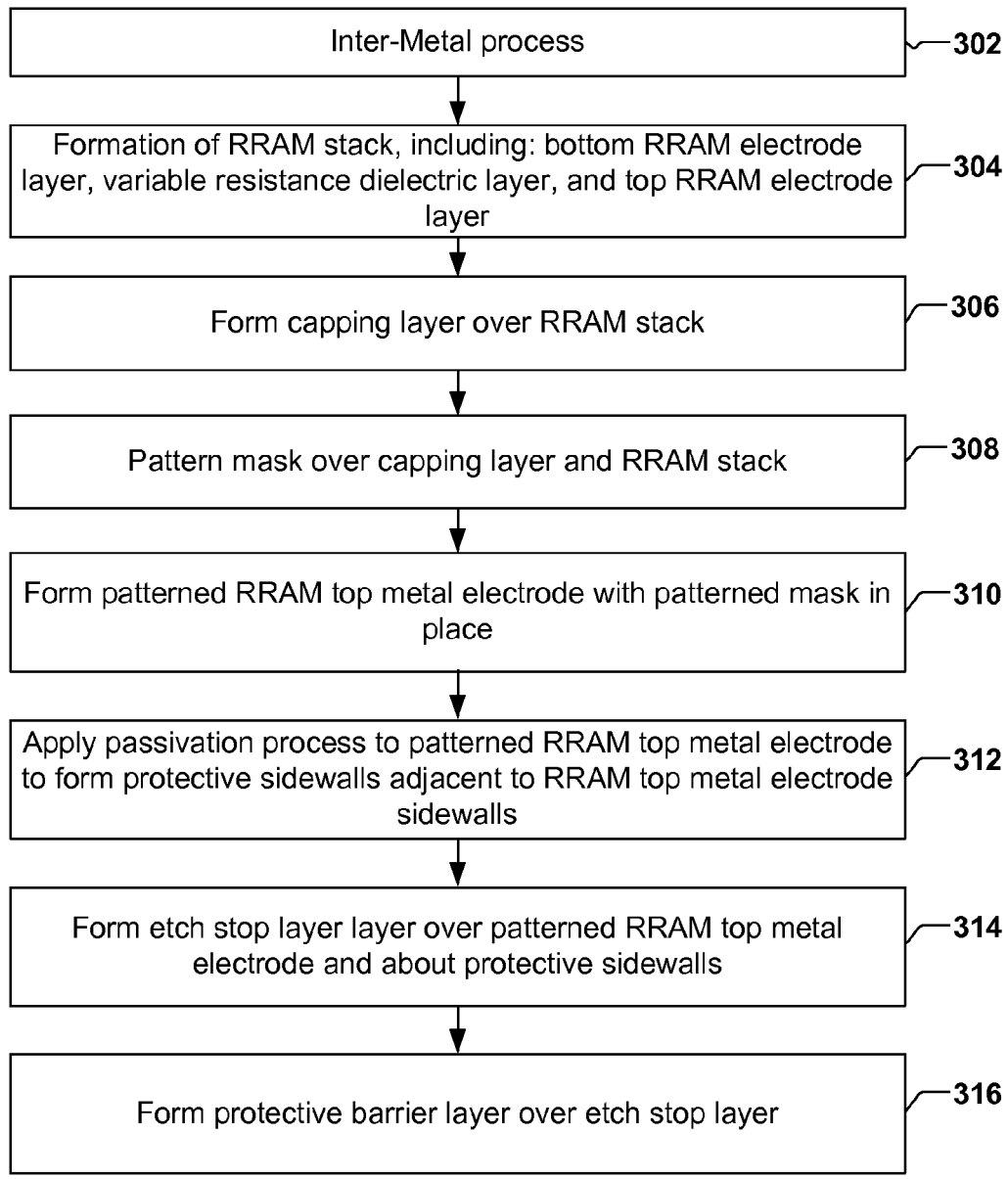
FIG. 3 illustrates a process flow in flow chart format in accordance with some embodiments.

FIG. 3 shows a methodology for forming an RRAM cell in accordance with some embodiments. It will be appreciated that not all illustrated steps are necessarily required, and in other embodiments some of these steps may be omitted. Further, in other embodiments, additional process steps which are not illustrated herein may be present. Further still in other embodiments, the order of the illustrated processing steps can be re-arranged. All such embodiments are contemplated as falling with the scope of the present disclosure.

In 302, an inter-metal process is used to form metal interconnect, such as alternating metal and insulating layers which are formed one on top of another, over a semiconductor substrate. In some embodiments the semiconductor substrate is a silicon substrate. However, the semiconductor substrate in more general terms may be a bulk semiconductor (e.g., silicon) wafer, a binary compound substrate (e.g., a GaAs wafer), a ternary compound substrate (e.g., AlGaAs), or higher order compound wafers, among others. Further, semiconductor substrate can also include non-semiconductor materials such as oxide in silicon-on-insulator (SOI), partial SOI substrate, polysilicon, amorphous silicon, or organic materials, among others. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g., epitaxial) layers formed on an underlying substrate.

In 304, a stack of RRAM layers are formed in or over the metal interconnect. The MIM layers include a RRAM bottom metal electrode layer, a variable dielectric layer over the RRAM bottom metal electrode layer, and an RRAM top metal electrode layer over the variable dielectric layer.

In 306, a capping layer is formed over the RRAM stack.

In 308, a mask is patterned over the capping layer and the RRAM stack.

In 310, an etch is carried out with the mask in place, thereby patterning the RRAM top metal electrode.

In 312, a passivation process is applied to the patterned RRAM top metal electrode to form protective sidewalls adjacent to outer sidewalls of the RRAM top metal electrode.

In 314, a conformal etch stop layer, such as an $SiO_2$ layer for example, is formed over the patterned RRAM top metal electrode and over the protective sidewalls.

In 316, a conformal protective layer, such as SiN layer for example, is formed over the conformal etch stop layer.

Turning now to FIGS. 4-10, one can see a series of cross-sectional views that collectively depict an RRAM cell manufacturing process in accordance with some embodiments.

Figure 4:
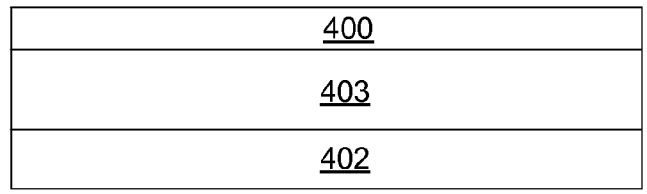
FIGS. 4-10 are a series of cross-sectional views that collectively depict an embodiment for manufacturing an RRAM cell in accordance with some embodiments.

In FIG. 4, a RRAM bottom metal electrode layer 400 is formed over a semiconductor substrate 402. In some embodiments the semiconductor substrate is a bulk silicon wafer. However, the semiconductor substrate can also be a silicon-on-insulator (SOI) wafer, which includes a handle wafer, a buried oxide (BOX) layer over the handle wafer, and a high quality silicon material over the BOX layer. In some embodiments, the substrate can be a binary compound substrate (e.g., a GaAs wafer), a ternary compound substrate (e.g., AlGaAs), or higher order compound wafers, among others. Further, the semiconductor substrate can also include a number of different materials, including but not limited to: polysilicon, amorphous silicon, or organic materials. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g., epitaxial) layers formed on an underlying substrate. For example, an interconnect structure 403 can be formed by forming successive insulating and conducting layers, and patterning them to provide electrical connections to devices in the substrate 402.

The RRAM bottom metal electrode layer 400 can have a thickness of approximately 150 Angstroms in some embodiments. In some embodiments, the RRAM bottom metal electrode layer 400 can be made up of more than one conductive layer. For example, in some embodiments, the RRAM bottom metal electrode layer 400 can include a lower TaN layer and an upper TiN layer. The lower TaN layer can be formed by PVD and have a thickness of approximately 100 angstroms. The upper TiN layer can be formed by PEALD and have a thickness of approximately 50 angstroms.

Figure 5:
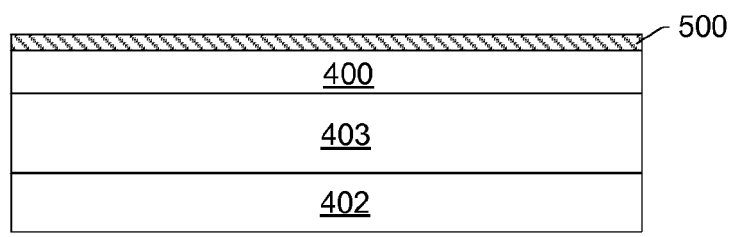

In FIG. 5, a variable resistance dielectric layer 500 is formed over the RRAM bottom metal electrode layer 400. In some embodiments, the variable resistance dielectric layer 500 is made of hafnium oxide ($HfO_2$).

Figure 6:
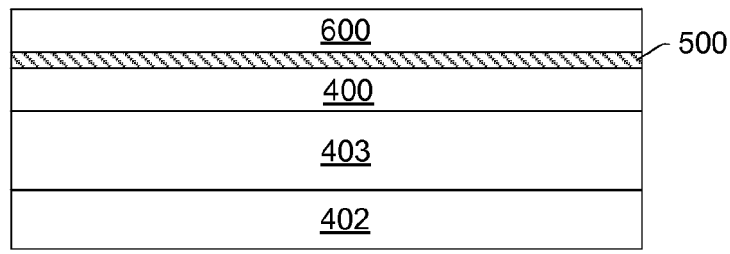

In FIG. 6, a RRAM top metal electrode layer 600 is formed over the variable resistance dielectric layer 500. The RRAM top metal electrode layer 600 can comprise TiN, and can have a thickness of approximately 150 Angstroms in some embodiments. In some embodiments, the RRAM top metal electrode layer 600 can be made up of more than one conductive layer. For example, in some embodiments, the RRAM top metal electrode layer 400 can include a lower Ti layer having a thickness of approximately 100 angstroms, and an upper TiN layer having a thickness of approximately 50 angstroms. In other embodiments, the RRAM top metal electrode layer 600 can include a lower Ti layer having a thickness of approximately 50 angstroms, a middle TiN layer having a thickness of approximately 50 angstroms, and an upper TaN layer having a thickness of approximately 50 angstroms.

Figure 7:
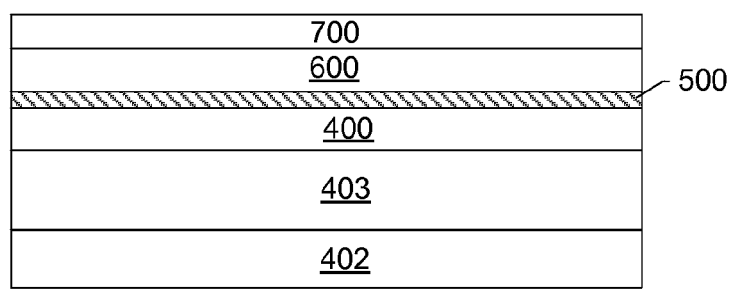

In FIG. 7, a capping layer 700 is formed over the RRAM top metal electrode layer 600. The capping layer 700 can comprise SiN or SiON, and can have a thickness of approximately 300 angstroms in some embodiments.

Figure 8:
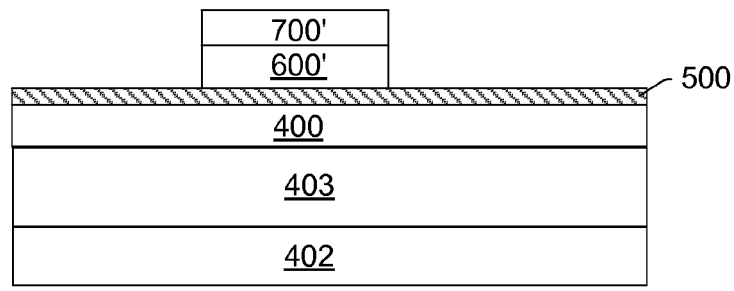

In FIG. 8, a top electrode mask (not shown) is patterned over the capping layer 700, and then an etch is carried out with the top electrode mask in place to form a patterned RRAM top metal electrode 600' with a patterned capping layer 700' there over.

Figure 9:
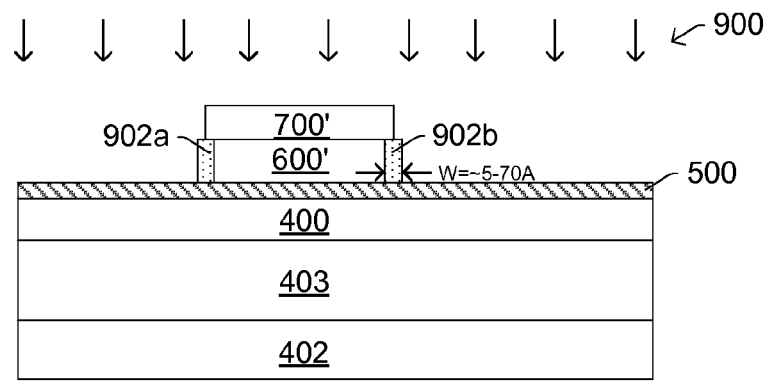

In FIG. 9, a passivation process 900 is carried out on the patterned RRAM top metal electrode 600' and patterned capping layer 700'. Although not expressly illustrated, the top electrode mask can be left in place over the patterned capping layer during passivation in some instances, but in other instances the mask can be removed prior to passivation. The passivation process 900 forms protective sidewalls 902a, 902b adjacent to outer top electrode sidewalls. In some embodiments, the passivation process can comprise applying an oxygen-containing gas or nitrogen-containing gas treatment to the patterned RRAM top metal electrode. For example, an $O_3$ treatment or an $N_2O$ treatment can be used to oxidize outermost top electrode sidewalls, thereby forming protective sidewalls 902a, 902b. The protective sidewalls 902a, 902b can each have a width of approximately 5 angstroms to approximately 70 angstroms and can each have an upper surface that meets a lower surface of the capping layer 700'. The protective sidewalls 902a, 902b can also have lower surfaces that meet an upper surface of variable resistance dielectric layer 500. In other embodiments, the protective sidewalls 902a, 902b can extend upwards at least partially impinge on or extend over the capping layer sidewalls, and/or can extend downwards at least partially into the variable resistance dielectric. Further, when grown by an oxidation process, due to the growth profile of the oxidation, the protective sidewalls can have inner sidewall surfaces that extend under an outer sidewall edge of capping layer 116; as well as outer sidewall surfaces that extend outward beyond the outer edge of the capping layer 166.

Figure 10:
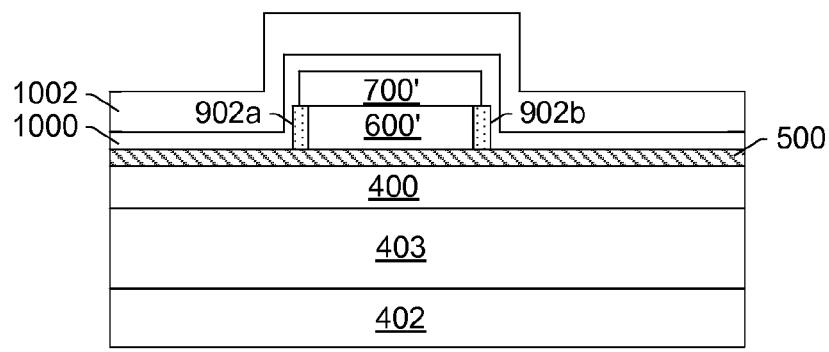

In FIG. 10, after the passivation process is carried out, an etch stop layer 1000, such as an SiO2 layer, is conformally formed over the structure. A conformal protective layer 1002, such as an SiN layer for example, is then formed over the etch stop layer 1000.

As can be appreciated from the above disclosure, some embodiments of the present disclosure relate to protective sidewalls adjacent to RRAM top metal electrodes. These sidewalls act as a barrier or buffer to prevent or limit residue from the RRAM top metal electrode sidewalls from damaging the variable resistance dielectric layer of the RRAM cell. The protective sidewalls also act as a barrier or buffer to prevent damage to the RRAM top metal electrode itself, and to prevent corresponding damage-susceptibility to the variable resistance dielectric when an etch is used to form the RRAM top metal electrode. The protective sidewalls can be made of a different material than the RRAM top metal electrode. For example, in some embodiments the RRAM top metal electrode is made of a first material that includes a metal component, and the protective sidewalls are made of a second material that includes the metal component and an oxide or nitride component.

Some embodiments relate to a resistive random access memory (RRAM). The RRAM includes a RRAM bottom metal electrode, and a variable resistance dielectric layer arranged over the RRAM bottom metal electrode. A RRAM top metal electrode is arranged over the variable resistance dielectric layer. A capping layer is arranged over the RRAM top metal electrode. A lower surface of the capping layer and an upper surface of the RRAM top metal electrode meet at an interface. Protective sidewalls are adjacent to outer sidewalls of the RRAM top metal electrode. The protective sidewalls have upper surfaces that are at least substantially aligned to the interface at which the upper surface of the RRAM top metal electrode meets the lower surface of the capping layer.

Other embodiments relate to a method. In the method, an RRAM stack is formed. The RRAM stack includes: a RRAM bottom metal electrode layer, a variable resistance dielectric layer, and a RRAM top metal electrode layer. A mask is patterned over the RRAM top metal electrode layer. An etch is performed with the mask in place over the RRAM top metal electrode layer to form a patterned RRAM top metal electrode. A passivation process is carried out to form protective sidewalls on sidewalls of the RRAM top metal electrode.

Yet other embodiments relate to an RRAM cell. The RRAM cell includes a RRAM bottom metal electrode, and a variable resistance dielectric layer arranged over the RRAM bottom metal electrode. An RRAM top metal electrode is arranged over the variable resistance dielectric layer. Protective sidewalls are adjacent to outer sidewalls of the RRAM top metal electrode. The protective sidewalls have upper surfaces at least substantially aligned to an upper surface of the RRAM top metal electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM), comprising:
    a RRAM bottom metal electrode;
    a variable resistance dielectric layer arranged over the RRAM bottom metal electrode;
    a RRAM top metal electrode arranged over the variable resistance dielectric layer;
    a capping layer arranged over the RRAM top metal electrode, wherein a lower surface of the capping layer and an upper surface of the RRAM top metal electrode meet at an interface; and
    protective sidewalls having a different composition than the capping layer and adjacent to outer sidewalls of the RRAM top metal electrode, the protective sidewalls having upper surfaces at least substantially aligned to the interface at which the upper surface of the RRAM top metal electrode meets the lower surface of the capping layer;
    wherein the RRAM top metal electrode is made of a first material that includes a metal component, and wherein the protective sidewalls are made of a second material that includes the metal component and an oxide or nitride component.

2. The RRAM of claim 1, wherein the RRAM top metal electrode comprises:
    a lower RRAM top metal electrode that includes titanium (Ti); and
    an upper RRAM top metal electrode arranged over the lower RRAM top metal electrode, wherein the upper RRAM top metal electrode includes TiN or TaN.

3. The RRAM of claim 1, wherein the protective sidewalls have a width ranging from 5 angstroms to 70 angstroms, as measured perpendicularly from an outer surface of an outer sidewall of the RRAM top metal electrode.

4. The RRAM of claim 1, wherein the variable resistance dielectric layer comprises hafnium oxide (HfO2).

5. The RRAM of claim 1, wherein the RRAM bottom metal electrode comprises:
    a lower RRAM bottom metal electrode that includes tantalum nitride (TaN); and
    an upper RRAM bottom metal electrode arranged over the lower RRAM bottom metal electrode, wherein the upper RRAM bottom metal electrode includes TiN.

6. The RRAM of claim 1, wherein the variable resistance dielectric layer extends continuously over the RRAM bottom metal electrode, and wherein the RRAM top metal electrode overlies less than all of the RRAM bottom metal electrode.

7. The RRAM of claim 1, wherein the capping layer comprises an SiN or SiON layer.

8. The RRAM of claim 1, further comprising:
    an etch stop layer conformally overlaying: the capping layer, the protective sidewalls, and portions of the variable resistance dielectric layer that are not covered by the RRAM top metal electrode.

9. A method, comprising:
    forming a RRAM stack, which includes: a RRAM bottom metal electrode layer, a variable resistance dielectric layer, and a RRAM top metal electrode layer;
    forming a capping layer over the RRAM top metal electrode layer;
    after forming the capping layer, patterning a mask over the RRAM top metal electrode layer and over the capping layer;
    performing an etch with the mask in place over the RRAM top metal electrode layer to form a patterned RRAM top metal electrode;
    applying a passivation process to form protective sidewalls on sidewalls of the RRAM top metal electrode; and
    wherein the capping layer has a different composition than the protective sidewalls and resides directly over an upper surface of the RRAM top metal electrode and over the protective sidewalls.

10. The method of claim 9, wherein the passivation process comprises applying an oxygen-containing gas or nitrogen-containing gas treatment to the patterned RRAM top metal electrode.

11. The method of claim 9, wherein the etch stops on the variable resistance dielectric layer.

12. The method of claim 9, wherein the RRAM top metal electrode layer is made of a first material that includes a metal component, and wherein the protective sidewalls are made of a second material that includes the metal component and an oxide component.

13. The method of claim 9, wherein the protective sidewalls have upper surfaces at least substantially aligned to an upper surface of the RRAM top metal electrode.

14. The method of claim 9, wherein the capping layer comprises an SiN or SiON layer.

15. The method of claim 9, wherein the protective sidewalls have upper surfaces at least substantially aligned to an interface at which the upper surface of the RRAM top metal electrode meets a lower surface of the capping layer.

16. A RRAM cell, comprising:
a RRAM bottom metal electrode;
a variable resistance dielectric layer arranged over the RRAM bottom metal electrode;
a RRAM top metal electrode arranged over the variable resistance dielectric layer;
protective sidewalls having a different composition than a capping layer and adjacent to outer sidewalls of the RRAM top metal electrode, the protective sidewalls having upper surfaces at least substantially aligned to an upper surface of the RRAM top metal electrode;
wherein the RRAM top metal electrode is made of a first material that includes a metal component, and wherein the protective sidewalls are made of a second material that includes the metal component and an oxide or nitride component.

17. The RRAM cell of claim 16, wherein the RRAM top metal electrode comprises titanium nitride (TiN) or tantalum nitride (TaN) and the protective sidewalls comprise titanium oxide nitride or tantalum oxide nitride.

18. A resistive random access memory (RRAM), comprising:
a RRAM bottom metal electrode;
a variable resistance dielectric layer arranged over the RRAM bottom metal electrode;
a RRAM top metal electrode arranged over the variable resistance dielectric layer;
a capping layer arranged over the RRAM top metal electrode, wherein a lower surface of the capping layer and an upper surface of the RRAM top metal electrode meet at an interface; and
protective sidewalls having a different composition than the capping layer and adjacent to outer sidewalls of the RRAM top metal electrode, the protective sidewalls having upper surfaces at least substantially aligned to the interface at which the upper surface of the RRAM top metal electrode meets the lower surface of the capping layer;
wherein the capping layer comprises an SiN or SiON layer.

19. A resistive random access memory (RRAM), comprising:
a RRAM bottom metal electrode;
a variable resistance dielectric layer arranged over the RRAM bottom metal electrode;
a RRAM top metal electrode arranged over the variable resistance dielectric layer;
a capping layer arranged over the RRAM top metal electrode, wherein a lower surface of the capping layer and an upper surface of the RRAM top metal electrode meet at an interface;
protective sidewalls having a different composition than the capping layer and adjacent to outer sidewalls of the RRAM top metal electrode, the protective sidewalls having upper surfaces at least substantially aligned to the interface at which the upper surface of the RRAM top metal electrode meets the lower surface of the capping layer; and
an etch stop layer conformally overlaying: the capping layer, the protective sidewalls, and portions of the variable resistance dielectric layer that are not covered by the RRAM top metal electrode.

* * * * *